United States Patent
Tadi et al.

(10) Patent No.: US 11,994,530 B1
(45) Date of Patent: May 28, 2024

(54) SYSTEM, METHOD AND APPARATUS OF A MOTION SENSING STACK

(71) Applicant: MINDMAZE GROUP SA, Lausanne (CH)

(72) Inventors: Tej Tadi, Lausanne (CH); Shashi Bobba, Lausanne (CH); Farzin Dadashi, Lausanne (CH)

(73) Assignee: MINDMAZE GROUP SA, Lausanne (CH)

(*) Notice: Subject to any disclaimer, the term of this patent is extended or adjusted under 35 U.S.C. 154(b) by 530 days.

(21) Appl. No.: 16/172,818

(22) Filed: Oct. 28, 2018

Related U.S. Application Data

(60) Provisional application No. 62/577,756, filed on Oct. 27, 2017.

(51) Int. Cl.
| | |
|---|---|
| *G01R 33/02* | (2006.01) |
| *G01C 19/5712* | (2012.01) |
| *G01P 13/00* | (2006.01) |
| *G01P 15/08* | (2006.01) |
| *G01P 15/18* | (2013.01) |

(52) U.S. Cl.
CPC .......... *G01P 13/00* (2013.01); *G01C 19/5712* (2013.01); *G01P 15/0802* (2013.01); *G01P 15/18* (2013.01); *G01R 33/0206* (2013.01)

(58) Field of Classification Search
CPC ...... G01P 13/00; G01P 15/18; G01P 15/0802; G01C 19/5712; G01R 33/0206
USPC ........................................................ 702/151
See application file for complete search history.

(56) References Cited

U.S. PATENT DOCUMENTS

| | | | | |
|---|---|---|---|---|
| 2006/0184336 | A1* | 8/2006 | Kolen | A63B 69/36 |
| | | | | 702/150 |
| 2012/0218444 | A1 | 8/2012 | Stach | |
| 2013/0106697 | A1* | 5/2013 | Kulik | G01C 21/165 |
| | | | | 345/158 |

(Continued)

FOREIGN PATENT DOCUMENTS

| | | | | |
|---|---|---|---|---|
| CN | 201911310478 | * | 12/2019 | G01C 17/38 |
| JP | 2020568664 | * | 2/2019 | G01C 17/38 |

(Continued)

OTHER PUBLICATIONS

Koyanagi, Mitsumasa. "3D-IC Technology Using Ultra-Thin Chips." Ultra-thin Chip Technology and Applications (2011): 109-123. (Year: 2011).*

(Continued)

*Primary Examiner* — Eyob Hagos
(74) *Attorney, Agent, or Firm* — GRAESER ASSOCIATES INTERNATIONAL INC.; D'vorah Graeser

(57) ABSTRACT

Embodiments of the present disclosure are directed to various systems, methods and apparatuses of a motion sensing stack, comprising a plurality of magnetometers. Preferably at least four magnetometers are included and at least one magnetometer is out of the plane of at least three other magnetometers. Preferably, the stack includes an 18D IMU (inertial measurement unit). Preferably, the 18D IMU features a 3D accelerometer, a 3D gyroscope and at least four 3D magnetometers. Alternatively, optionally a 9D IMU is provided, comprising a 3D accelerometer, a 3D gyroscope and one 3D magnetometer. The IMU may optionally be MEMS (microelectromechanical system) based.

20 Claims, 11 Drawing Sheets

(56) References Cited

U.S. PATENT DOCUMENTS

| | | |
|---|---|---|
| 2013/0110450 A1 | 5/2013 | Kulik |
| 2013/0278755 A1 | 10/2013 | Starns |
| 2014/0125325 A1 | 5/2014 | Ocak |
| 2014/0130595 A1* | 5/2014 | Zhao ............... G01C 19/5783 73/495 |
| 2014/0198227 A1 | 7/2014 | Mohammad Mirzaei |
| 2015/0071627 A1 | 3/2015 | Hoang |
| 2015/0251903 A1* | 9/2015 | Bowles ................ H01L 25/50 257/415 |
| 2015/0319365 A1 | 11/2015 | Lloyd |
| 2016/0047675 A1 | 2/2016 | Tanenhaus |
| 2016/0187142 A1 | 6/2016 | Larsen |
| 2017/0089948 A1 | 3/2017 | Ho |
| 2017/0123035 A1 | 5/2017 | Clark |
| 2017/0195579 A1 | 7/2017 | Desai |
| 2017/0277176 A1* | 9/2017 | Hutson ................ B64C 39/024 |
| 2018/0074090 A1* | 3/2018 | Boysel ................ B81C 1/00309 |
| 2018/0080768 A1* | 3/2018 | Vasilyuk ................ G01C 17/38 |
| 2018/0238930 A1 | 8/2018 | Nguyen |
| 2018/0246529 A1* | 8/2018 | Hu ..................... G05D 1/0016 |
| 2018/0356492 A1 | 12/2018 | Hamilton |
| 2019/0133694 A1 | 5/2019 | Barrera |
| 2020/0233053 A1* | 7/2020 | Vissiere ................ G01C 17/38 |
| 2021/0041220 A1 | 2/2021 | Van Weeren |
| 2021/0042522 A1 | 2/2021 | Dias Bispo Carvalho |

FOREIGN PATENT DOCUMENTS

| | | | |
|---|---|---|---|
| WO | 2011147947 A1 | 12/2011 | |
| WO | WO-2011147947 A1 * | 12/2011 | ........... G01B 11/026 |
| WO | 2016090467 A1 | 6/2016 | |
| WO | 2016145535 A1 | 9/2016 | |

OTHER PUBLICATIONS

Translation WO-2011147947-AI (Year: 2011) 23 pages.

* cited by examiner

SYSTEM, METHOD AND APPARATUS OF A MOTION SENSING STACK

FIELD OF THE DISCLOSURE

The present disclosure, in at least some embodiments, is directed to systems, methods, and apparatuses of a motion sensing stack, and in particular, for such systems, methods, and apparatuses featuring a plurality of magnetometers.

BACKGROUND

An IMU (inertial measurement unit) includes an accelerometer and a gyroscope. Such units can be used for determining the acceleration and relative location of a device containing same. However, the IMU does have drawbacks with regard 6DoF tracking accuracy.

Thus, a need exists for methods, apparatuses, and systems that can fuse data from a plurality of such sensors, that is able to overcome the drawbacks of an IMU.

SUMMARY OF SOME OF THE EMBODIMENTS

Embodiments of the present disclosure include systems, methods and apparatuses of a motion sensing stack, comprising an IMU and a plurality of magnetometers. Preferably at least four magnetometers are included and at least one magnetometer is out of the plane of at least three other magnetometers. Preferably, the motion sensing stack features a 3D accelerometer, a 3D gyroscope and at least four 3D magnetometers, configured as an 18D IMU. Alternatively, optionally a 9D IMU, comprising of a 3D accelerometer, a 3D gyroscope and one 3D magnetometer, can be grouped together with at least three 3D magnetometers. The IMU may optionally be MEMS (microelectromechanical system) based.

Optionally, a 3D accelerometer, a 3D gyroscope and three 3D magnetometers may be provided in a 15D IMU.

Unless otherwise defined, all technical and scientific terms used herein have the same meaning as commonly understood by one of ordinary skill in the art to which this disclosure belongs. The materials, methods, and examples provided herein are illustrative only and not intended to be limiting.

Various embodiments of the methods, systems and apparatuses of the present disclosure can be implemented by hardware and/or by software or a combination thereof. For example, as hardware, selected steps of methodology according to some embodiments can be implemented as a chip and/or a circuit. As software, selected steps of the methodology (e.g., according to some embodiments of the disclosure) can be implemented as a plurality of software instructions being executed by a computer (e.g., using any suitable operating system). Accordingly, in some embodiments, selected steps of methods, systems and/or apparatuses of the present disclosure can be performed by a processor (e.g., executing an application and/or a plurality of instructions).

Although embodiments of the present disclosure are described with regard to a "computer", and/or with respect to a "computer network," it should be noted that optionally any device featuring a processor and the ability to execute one or more instructions is within the scope of the disclosure, such as may be referred to herein as simply a computer or a computational device and which includes (but not limited to) any type of personal computer (PC), a server, a cellular telephone, an IP telephone, a smartphone, a PDA (personal digital assistant), a thin client, a mobile communication device, a smartwatch, head mounted display or other wearable that is able to communicate wired or wirelessly with a local or remote device. To this end, any two or more of such devices in communication with each other may comprise a "computer network."

BRIEF DESCRIPTION OF THE DRAWINGS

Embodiments of the disclosure is herein described, by way of example only, with reference to the accompanying drawings. With specific reference now to the drawings in detail, it is stressed that particulars shown are by way of example and for purposes of illustrative discussion of the various embodiments of the present disclosure only, and are presented in order to provide what is believed to be a useful and readily understood description of the principles and conceptual aspects of the various embodiments of inventions disclosed therein.

DETAILED DESCRIPTION OF SOME OF THE EMBODIMENTS

Figure 1A:
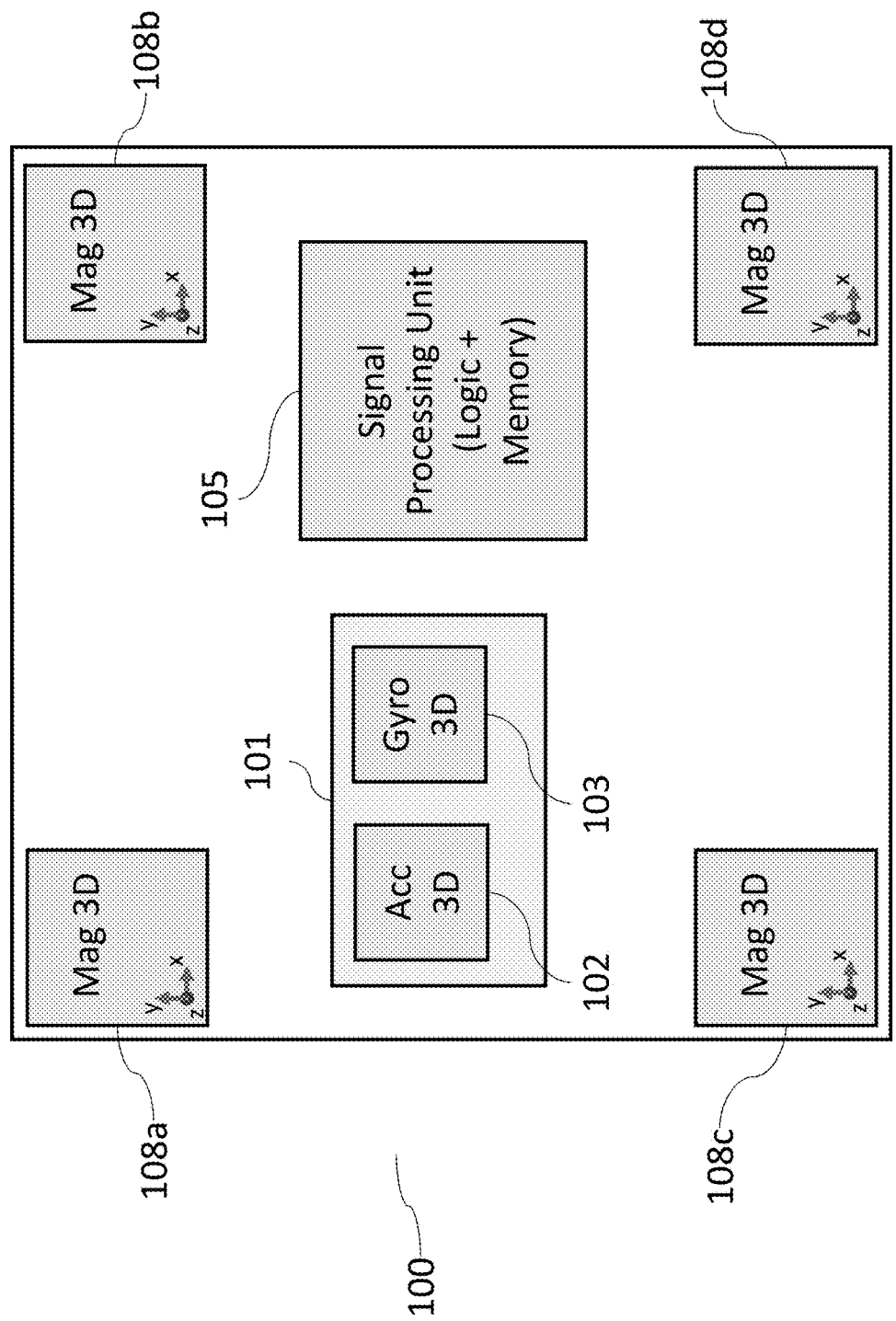
FIG. 1A shows a schematic of a non-limiting example of a modular system design containing the IMU and a plurality of distributed magnetometers along with the signal processing unit, while FIG. 1B relates to the optional geometry of placement of only the magnetometers, according to at least some embodiments

FIG. 1A shows a schematic of a non-limiting example of a modular system containing the IMU and a plurality of distributed magnetometers, according to at least some embodiments. A system (100) features a 6D IMU 101, including a 3D accelerometer (102) and a 3D gyroscope (103). System 100 includes four 3D magnetometers with high sensitivity, shown as magnetometers 108a, 108b, 108c, 108d. Preferably, no more than 3 magnetometers are in the same plane. System 100 also includes a signal processing unit 105 which will process all the data from these various sensors. Signal processing unit 105 also includes a controller or other microprocessor or processor, for controlling the functions of the various components. Signal processing unit 105 also includes memory, for example for storing one or more commands to control the functions of the various components of system 100. The processor centralizes data acquisition at 6D IMU 101, and magnetometers 108a, 108b, 108c and 108d. Signal processing unit 105 is also responsible to apply the calibration to data received from each sensing module and applying the tracking algorithm.

Preferably, magnetometers 108a, 108b, 108c, 108d are arranged in a triangular pyramid. The minimum bound on the slant height, with respect to the sensitivity of magnetometers 108a, 108b, 108c, 108d and also the distance between them, may optionally be determined as described with regard to FIGS. 1B and 1C.

If system 100 is implemented on a chip, then preferably other components required or preferred for the operation of such a chip are included. For example and without limitation, as a chip, system 100 would preferably include a power source, a bus and the like, as shown in a non-limiting implementation in FIG. 7.

Figure 1B:
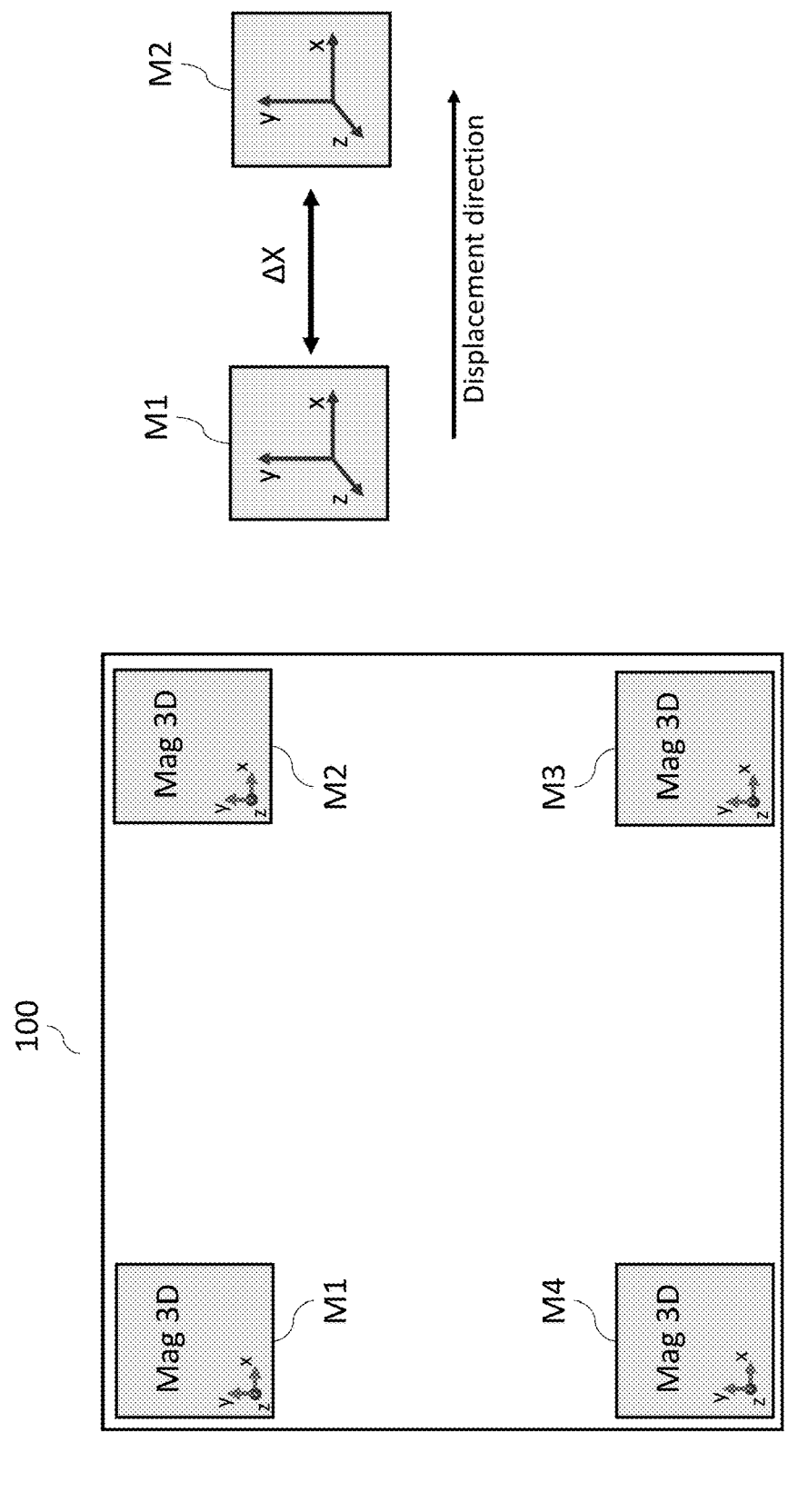
FIG. 1C shows an actual, exemplary flow.
Figure 1C:
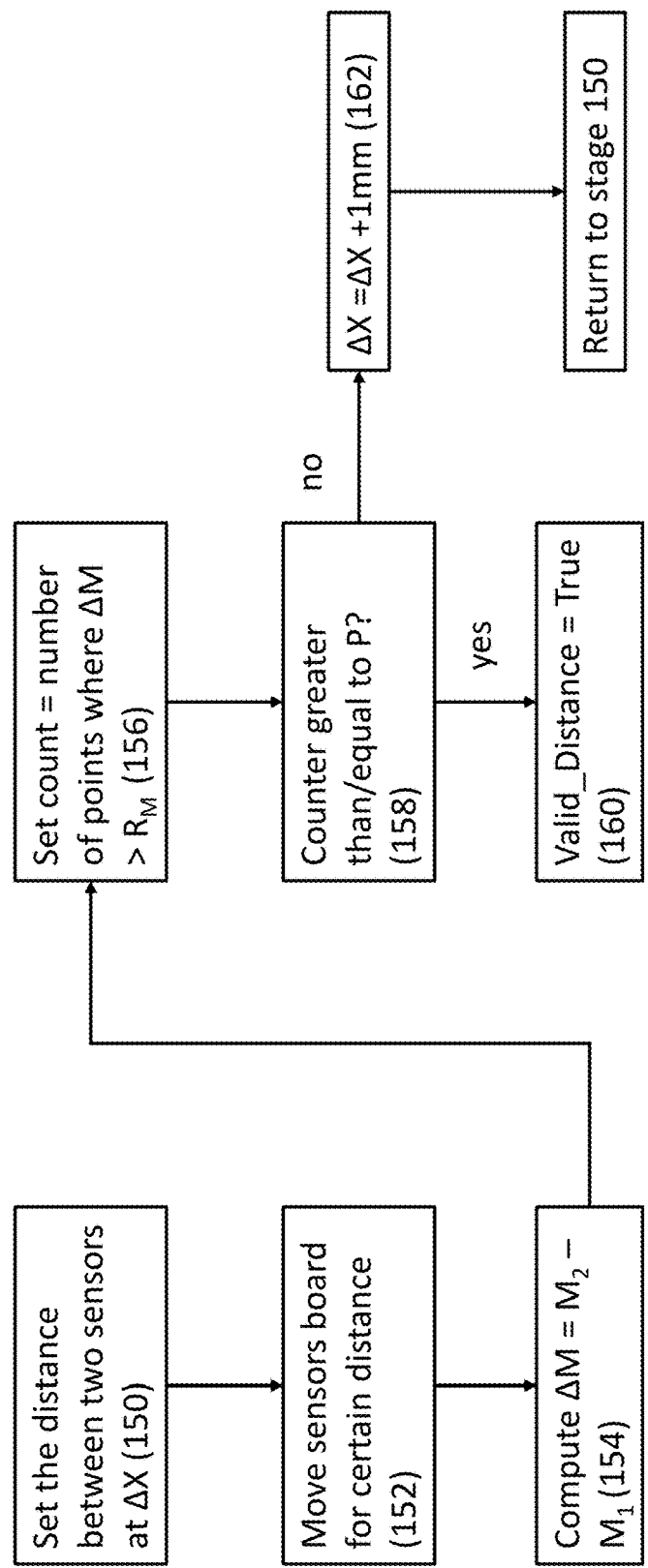

FIG. 1B relates to the preferred minimum distance between two magnetometers. A non-limiting example of a way to determine the preferred minimum distance is as follows. For two magnetometers with resolution $R_M$, do the following steps (actual flow shown in FIG. 1C):

Valid_Distance=False, ΔX=some number, such as 5 mm while not Valid_Distance:
1. Set the distance between two sensors at ΔX (stage 150)
2. Repeat a certain number of times, say 50 times, every certain period of time, say 2 seconds (the end of which repetitions is determined with regard to stage 156):
   i. Move sensors board in X direction for a certain distance, say 5 mm (stage 152)
   ii. Compute $\Delta M = M_2 - M_1$ (stage 154)
3. count=number of points where $\Delta M > R_M$ (stage 156)
4. If count greater than or equal to a certain number (P), say 40, as considered with regard to stage 158, Valid_Distance=True (stage 160)
   Else: ΔX=ΔX+1 mm (stage 162) and the process then returns to stage 150

The distribution of magnetometers 108a, 108b, 108c, 108d (shown in FIG. 1B as M1, M2, M3 and M4) is preferably such that an optimal geometry is determined for providing tracking data.

Figure 2:
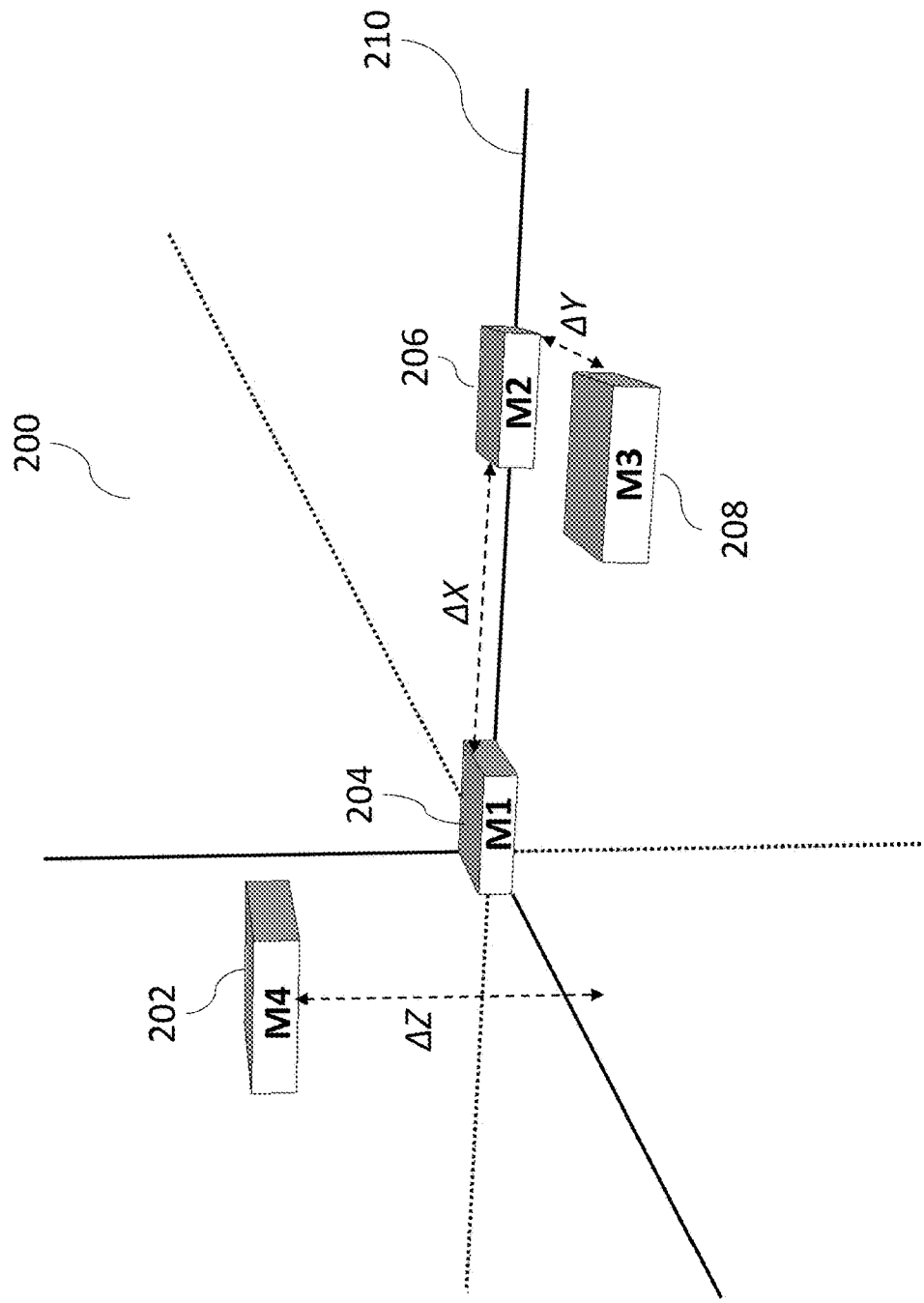
FIG. 2 shows a non-limiting perspective view of the geometry of magnetometers placement, according to at least some embodiments.

FIG. 2 shows a non-limiting perspective view of the geometry of magnetometers placement, according to at least some embodiments. Magnetometers are shown displaced in 3D space, with minimum bound on ΔX, ΔY, and ΔZ. A magnetometer apparatus 200 is shown as comprising four magnetometers 202, 204, 206 and 208. A plane 210 is explicitly shown, which could for example optionally comprise one of the dies (with MEMS components) stacked in 3D Integrated chip.

Magnetometers 204, 206 and 208 are in the same plane, shown as plane 210. Magnetometer 202 is in a different plane, such that magnetometer 202 is not in plane 210. Because magnetometer 202 is out of plane, data obtained from magnetometer 202 enable the calculation of a differential gradient for the magnetic field in the third dimension between magnetometers 204, 206 and 208, and magnetometer 202.

It should be noted that four magnetometers placed in the same plane will also enable the calculation of a differential gradient of the magnetic field, but only in two dimensions.

However, by having the one of the magnetometers displaced in a different plane, the gradients follows a triangular pyramid, and so the gradient is calculated in all the three dimensions.

Figure 3:
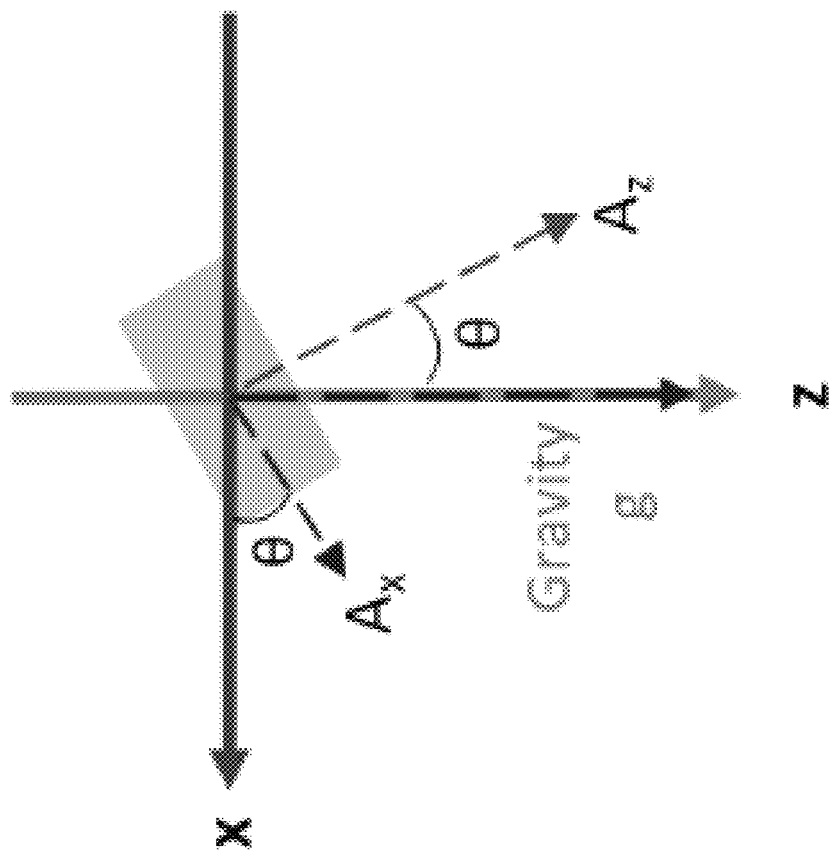
FIG. 3 shows a non-limiting geometry for data fusion with IMU data.

FIG. 3 shows a non-limiting geometry for data fusion with IMU data, specifically relating to accelerometer data. An exemplary data fusion algorithm is described with regard to FIGS. 4A and 2B for fusing the various data points available from system 100 for example. While data fusion may optionally be used for many purposes, in the non-limiting example of FIGS. 3 and 4A/B, it is used for tracking system 100 through a map.

For any rotation around the z-axis, the gravity vector keeps aligned with the axis, therefore providing no extra information. On top of that, in the presence of accelerations different from the gravity, the angle measurement cannot be achieved by only using accelerometer since the measure acceleration will no longer be 1 g. Therefore, another source of information is required to find the exact orientation of the accelerometer to be able to remove gravitational source of acceleration from the component due to the accelerometer's movement. In order to obtain the acceleration purely due to the movement, the accelerometer reading should be rotated to the global frame of reading where it is possible to determine the effect of gravity.

Figure 4A:
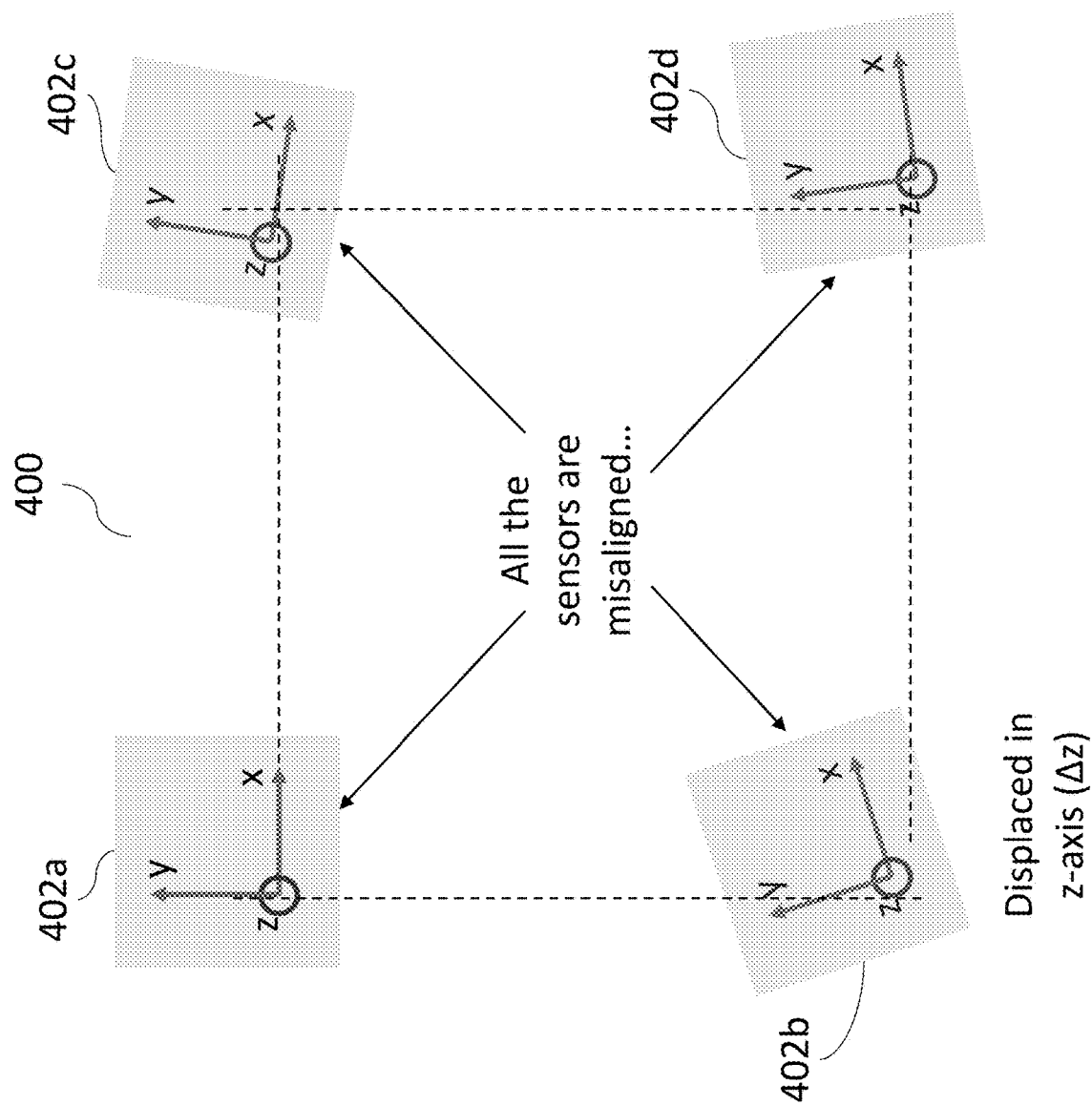
FIGS. 4A and 4B highlight the practical issue of misalignment of the magnetometers.
Figure 4B:
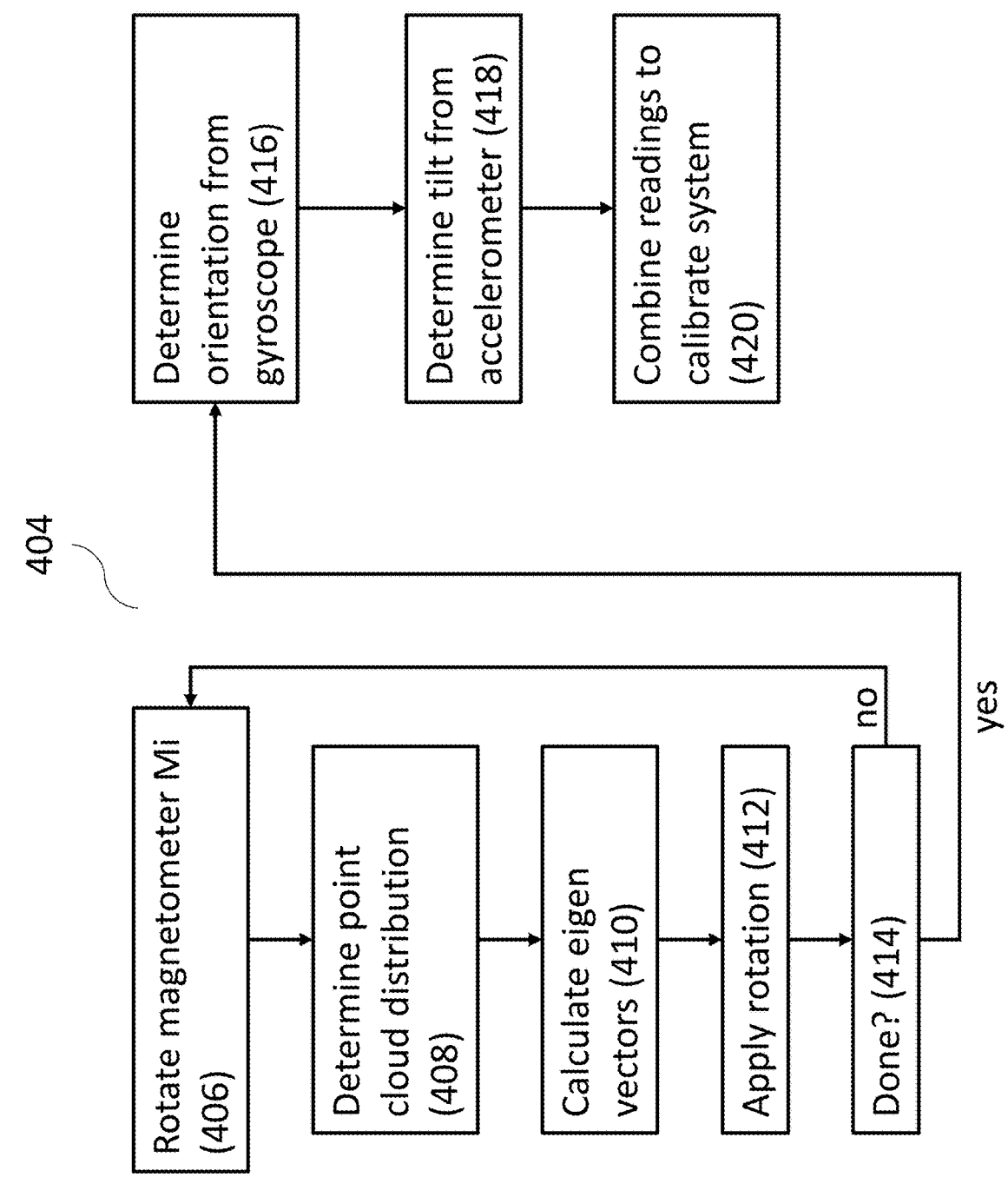

FIG. 4A shows magnetometer frames which are misaligned due to mismatch during production, while FIG. 4B shows the non-limiting, exemplary data flow to compensate for such a misalignment. In a system of magnetometers 400, to compensate for the misalignment between magnetometers 402a, 402b, 402c, and 402d a calibration process is required as follows. For magnetometer i=1, 2, 3, 4 do the following (shown in the method of FIG. 4B) in a method 404:

At point P rotate magnetometer Mi, for example through a FIG. 8 pattern, with a robotic arm (406).
Determine the point cloud distribution, Vi, for each Mi (408)
Calculate Eigen vectors of the principal directions of the point cloud distribution, Vi, for each Mi (410)
Apply the following rotation to calibrate the frame of magnetometers in 412, with regard to a selected magnetometer such as M1:

$Ri = \text{Transpose}(Vi) \cdot V1$

Next it is determined whether the magnetometer Mi has been sufficiently calibrated with regard to the selected magnetometer in 414. If not, then the process preferably returns to 406 to be repeated.

The calibration process may end at 414 as the magnetometers are calibrated to each other. Optionally it continues, as shown in FIG. 4B, with further calibration with the gyroscope and the accelerometer readings also incorporated. The gyroscope is a sensor which measures the angular velocity of the body to which it is attached (by using the Coriolis Effect). It is possible to determine the sensor orientation information from a discretized sum of gyroscope's signal as follows:

$$q_t = \frac{0.5}{f} \begin{pmatrix} 2 & -\omega_t^x & -\omega_t^y & -\omega_t^z \\ \omega_t^x & 2 & \omega_t^z & -\omega_t^y \\ \omega_t^y & -\omega_t^z & 2 & \omega_t^x \\ \omega_t^z & \omega_t^y & -\omega_t^x & 2 \end{pmatrix} q_{t-1}$$

Where $q_t$ is the quaternion representing the rotation of the sensor with regard to a reference frame of coordination at time t and $\omega_t^x$, $\omega_t^y$, $\omega_t^z$ form gyroscope 3D measurement at time t and f is sampling frequency of the device. Nonetheless, this integration introduces error in the orientation due to the existence of time variant bias on gyroscope's signal.

A magnetometer is a device capable of measuring the magnetic fields across each one of the axes of the device. In the absence of any major electromagnetic interference, the magnetic field detected by this sensor is the one coming from the earth magnetic field, which makes the magnetometer read the heading angle with respect to the magnetic north as a global reference of orientation; An important aspect about using a magnetometer, however, is its vulnerability in the presence of additional sources of electromagnetic sources, which can distort significantly the sensor's reading.

So, to improve the orientation estimation, an approach is to fuse the orientation calculated from the gyroscope with tilt estimation from accelerometer and with azimuth estimation from magnetometer, for example optionally using an optimal estimator such as a Kalman filter. The position can be obtained by a double integration of the acceleration in the global frame of navigation. However, drift occurs very quickly with (double) integration of accelerometer signals (seconds) and relatively quickly with (single) integration of gyros (minutes).

The method 404 may therefore continue with determining the orientation calculated from the gyroscope in 416. Next the tilt estimation from the accelerometer is determined in 418. The orientation and tilt information is preferably combined with the magnetometer azimuth estimation in 420, to further calibrate the system. Optionally, the method steps from 416 to 420 may also be repeated during operation of the system, as described below.

Although the IMU is prone to drift and to issues regarding the initial calibration, it does have a number of strengths that can counterbalance weaknesses of other methods. For example and without limitation, the high frequency of operation (400 Hz for example), operates without regard to external illumination conditions and provides reliable tracking in short-timespan.

Some optional uses for integrating the IMU data include finding the map scale and the gravity axis in the map coordinate system (necessary to use accelerometer data) and dead reckoning via IMU.

Map scale may optionally be recovered as follows. Optionally, an alternative system, such as an optical system, provides 3D position p_s(t) and orientation R_s(t) as functions of time t. From that, one can compute the accelerations of the camera a_s(t) by numerically deriving twice p_s with respect to t.

Assuming the IMU device and the camera sensor are placed at the same point, the optical data is related to the measured acceleration a_i(t):

$$a\_i(t)=R\_s(t)*(s*a\_s(t)+g)$$

where g is the gravity vector expressed in m/s^2 in the map world coordinate system, and s the map scale.

By recording optical and IMU data during a correctly tracked motion that contains acceleration, it is possible to recover g and s.

It is possible to estimate position with IMU (dead reckoning) as follows. Assume that visual tracking is accurate until time t, after which it ceases to be accurate. It is necessary to estimate position at t+d.

Rotation estimation is estimated at the last known position: A(t)=R(t)

Then one can recursively integrate rotation:

$$A(t+dt):=A(t)\cdot\exp(G(t)*dt)$$

where G(t) is a skew-symmetric matrix of gyro readings and dt is sampling period.

Then it is possible to initialize position and velocity estimates:

$$e(t)=p\_s(t)$$

$$v(t)=(p\_s(t)-p\_s(t-dt))/dt$$

The following can then be updated:

$$v(t+dt):=v(t)+a\_i(t+dt)*dt$$

$$p(t+dt):=p(t)+v(t+dt)*dt$$

Figure 5A:
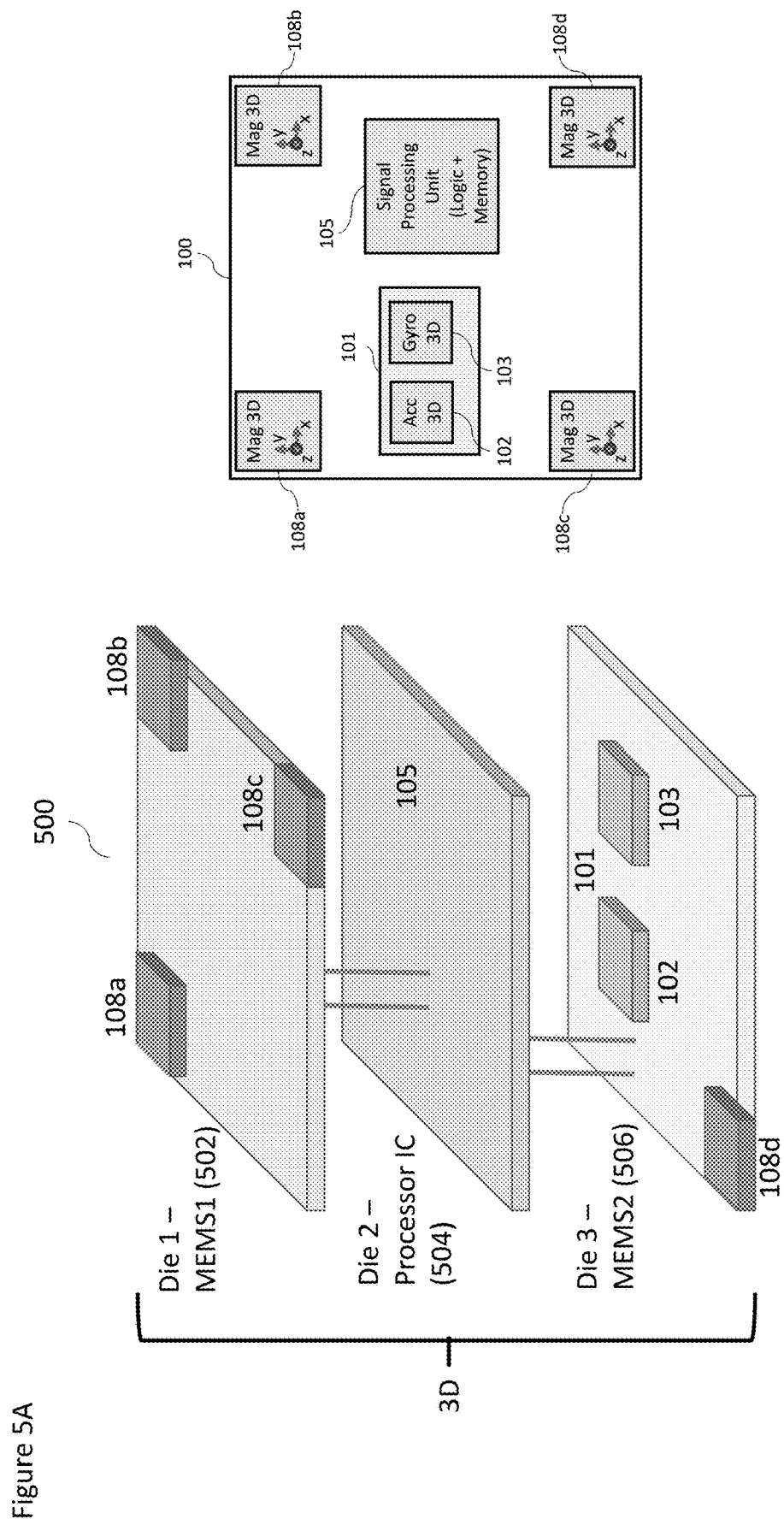
FIG. 5A illustrates a non-limiting example of 3D system-in-package implementation of the proposed IMU stack with 4 magnetometers.

FIG. 5A illustrates a non-limiting implementation of a System-in-package of System 100, shown as a system in package 500. In order to displace one of the magnetometers in the vertical plane, optionally the system is implemented with two different dies with the MEMS components.

Die 1, MEMS1 (502) encompasses three magnetometers 108a, 108b and 108c, at the three corners of the die.

Die 2 (504) can be a standard digital IC die which preferably features a signal processing unit 105 with both Logic and memory blocks.

Die 3, MEMS2 (506) encompasses one Magnetometer 108d along with the 3D Gyroscope (102) and Accelerometer (103) in an IMU 101. Ideally the 3D magnetometer (108d) should be placed in the corner of the die which does not overlap with any Magnetometers in vertical plane of Die 1.

Preferably dies 502, 504 and 506 are interconnected through a TSV (Through Silicon Via) or a similar vertical electrical connection.

The illustration in FIG. 5A is non-limiting example for System-in-package solution for stacking dies in compact 3D packaging. However, similar block partitioning can be applied while stacking package on top of each other. An alternative extension can be stacking of PCBs on top of each other and a similar block level partitioning can be envisaged.

Figure 5B:
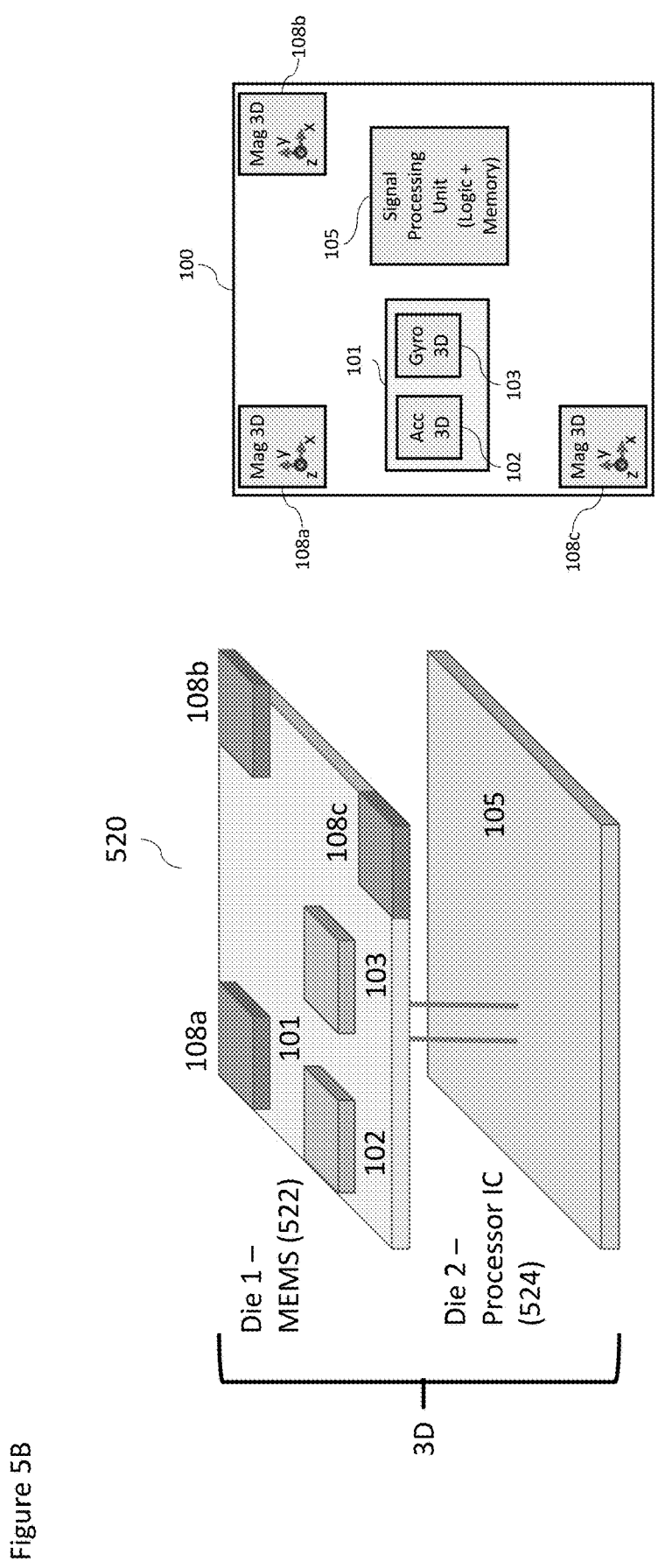
FIG. 5B illustrates a non-limiting example of 3D system-in-package implementation of the proposed IMU stack with 3 magnetometers.

FIG. 5B illustrates a non-limiting example of 3D system-in-package implementation of the proposed IMU stack with 3 magnetometers. As shown, FIG. 5B illustrates a non-limiting implementation of a System-in-package of a variation on the previously described system, shown as a system in package 520, with three magnetometers. Components with the same reference numbers have the same or similar function as those described previously.

Die 1, MEMS1 (522) encompasses three magnetometers 108a, 108b and 108c, at the three corners of the die. Die 1 522 also preferably comprises the 3D Gyroscope (102) and Accelerometer (103) in an IMU 101.

Die 2 (524) can be a standard digital IC die which preferably features a signal processing unit 105 with both Logic and memory blocks.

Preferably dies 522 and 524 are interconnected through a TSV (Through Silicon Via) or a similar vertical electrical connection.

Figure 6:
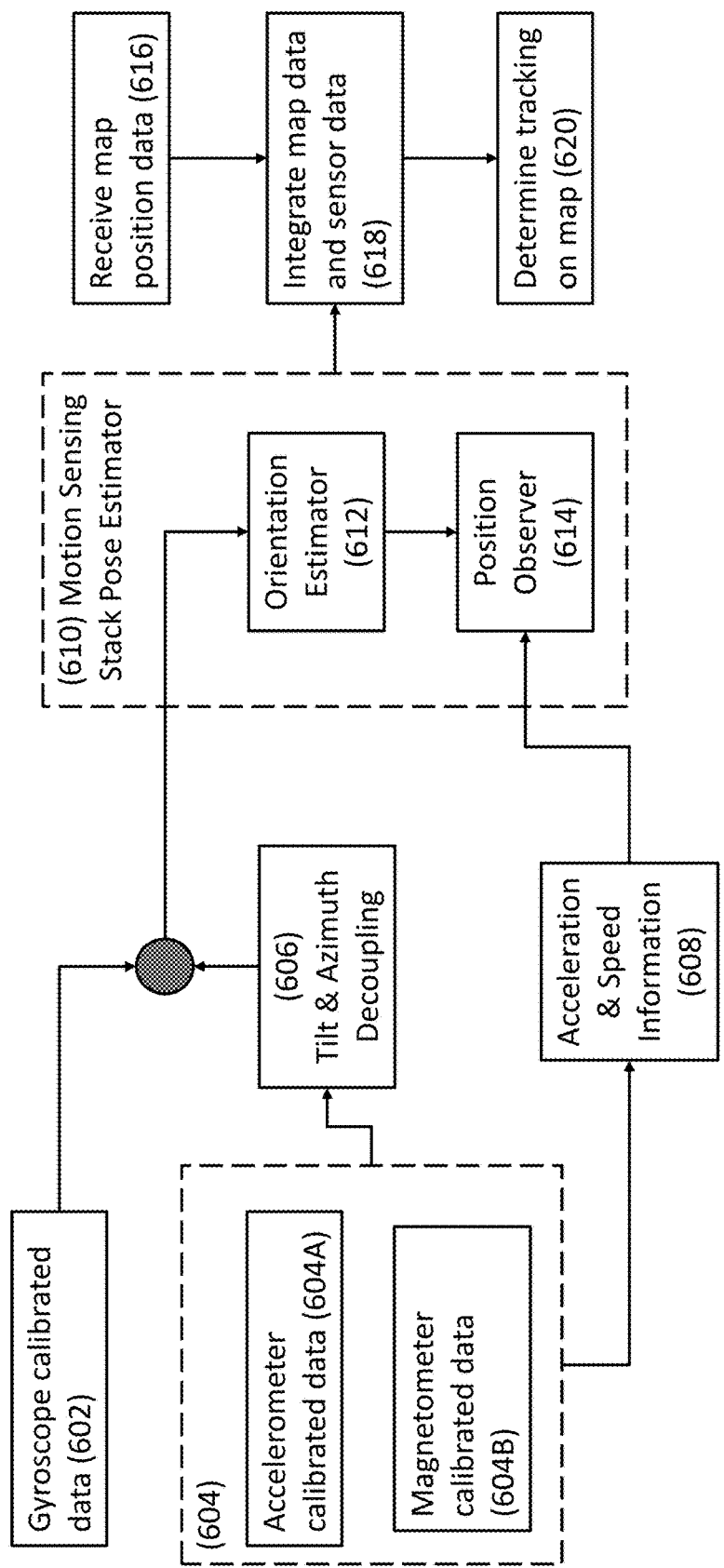
FIG. 6 is a non-limiting, exemplary data fusion algorithm, according to at least some embodiments.

FIG. 6 is a non-limiting, exemplary data fusion process, according to at least some embodiments. As shown in a method 600, in stage 602, gyroscope calibrated data is provided. In stage 604, the orientation is estimated from accelerometer calibrated data (604A) and magnetometer calibrated data (604B). In stage 606 tilt estimation is decoupled from azimuth estimation to reduce the effect of magnetic field perturbation on accuracy of orientation.

In stage 608, acceleration and speed information is received from stage 604.

In stage 610, motion sensing stack pose estimation is performed, from an orientation estimator 612 and a position observer 614. Orientation estimator 612 receives the output of stages 602 and 606. Position observer 614 receives the estimated orientation and the output of stage 608. These various types of sensor data are used to estimate the position, for example optionally using an optimal estimator such as a Kalman filter.

In stage 616, map position data is received, preferably calculated from another source of sensor data, such as optical data for example and without limitation. In stage 618, map position data and the fused sensor data are preferably integrated. Next, in stage 620, tracking of the position of the apparatus including system 100 is determined on the map, according to the integration.

Figure 7:
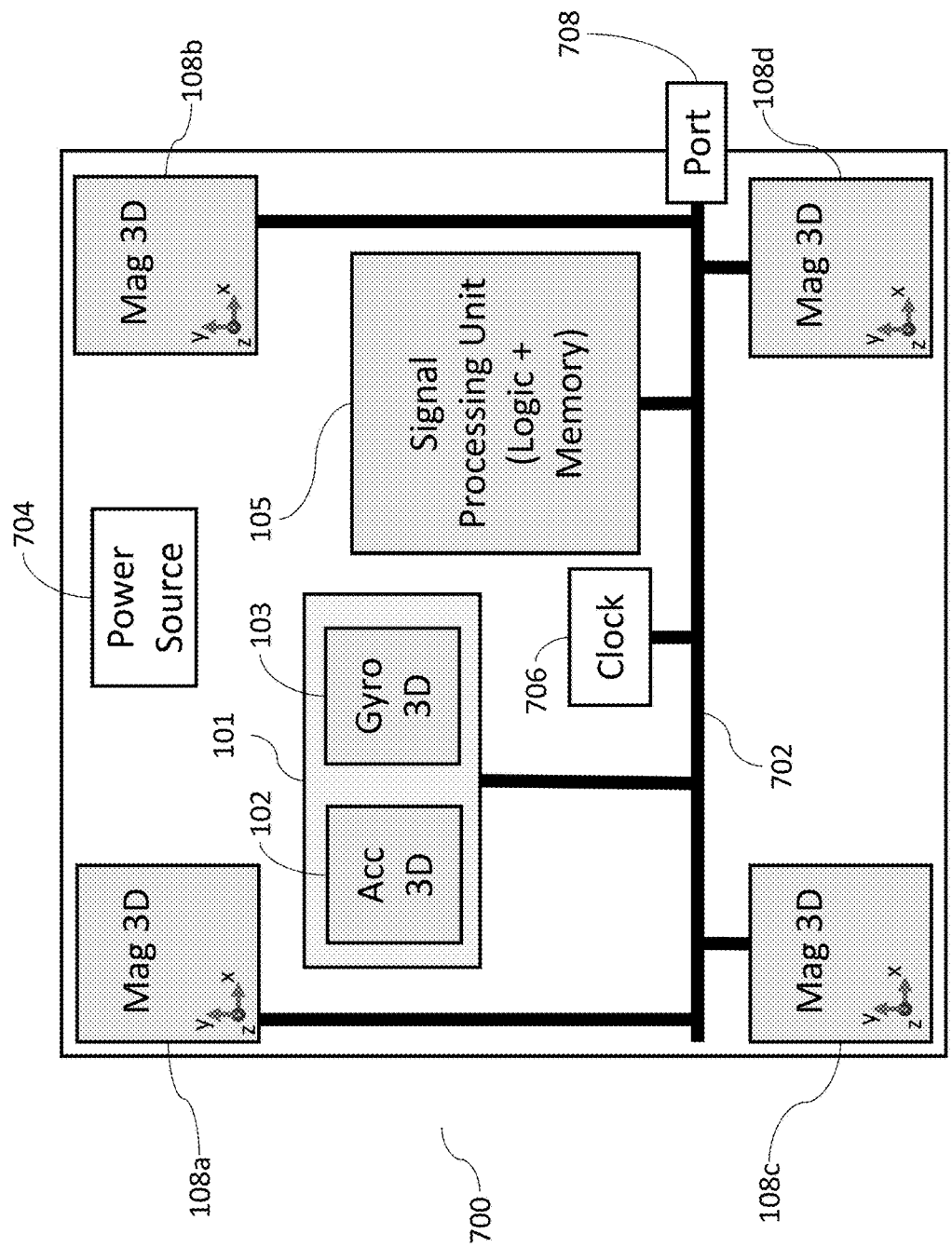
FIG. 7 shows a non-limiting exemplary implementation of a system as shown herein on a chip.

FIG. 7 shows a non-limiting exemplary illustrative implementation of a system as shown herein, such as for example the system of FIG. 1A, as implemented through a chip. In this non-limiting example, the implementation is shown schematically with regard to two dimensions, although it could also be implemented three dimensionally. Components with the same reference numbers as FIG. 1A have the same or similar function. A chip 700 features the previously described components of system 100 of FIG. 1A, connected by a bus 702. Bus 702 is preferably able to handle all of the different types of traffic between the different components present on chip 700, although alternatively a plurality of busses are present (not shown). Communication through bus 702 may occur sequentially as each component sends necessary information, which is then received and acted upon by one or more additional components. Bus 702 may also be capable of multiplexed communications, or of such types of communication as time divisional multiple access, and so forth. Alternatively, the interconnection between all the hardware blocks on the chip 700 could be implemented as a network on a chip.

Chip 700 further comprises a power source 704 for providing power to the components of the chip. Power source 704 is controlled by signal processing unit 105.

A clock 706, preferably part of signal processing unit 105 or at least under the control of signal processing unit 105, provides timing functions for chip 700. To facilitate reading information from, or writing information or commands to, chip 700, preferably a port 708 is provided, to support such read/write capabilities. The interconnect delay, and thus the length and width of the interconnect (not shown), from the processing unit to all the magnetometers 108A, 108B, 108C and 108D, is preferably the same so that data is read synchronously.

Any and all references to publications or other documents, including but not limited to, patents, patent applications, articles, webpages, books, etc., presented in the present application, are herein incorporated by reference in their entirety.

Example embodiments of the devices, systems and methods have been described herein. As noted elsewhere, these embodiments have been described for illustrative purposes only and are not limiting. Other embodiments are possible and are covered by the disclosure, which will be apparent from the teachings contained herein. Thus, the breadth and scope of the disclosure should not be limited by any of the above-described embodiments but should be defined only in accordance with claims supported by the present disclosure and their equivalents. Moreover, embodiments of the subject disclosure may include methods, systems and apparatuses which may further include any and all elements from any other disclosed methods, systems, and apparatuses, including any and all elements corresponding to target particle separation, focusing/concentration. In other words, elements from one or another disclosed embodiments may be interchangeable with elements from other disclosed embodiments. In addition, one or more features/elements of disclosed embodiments may be removed and still result in patentable subject matter (and thus, resulting in yet more embodiments of the subject disclosure). Correspondingly, some embodiments of the present disclosure may be patentably distinct from one and/or another reference by specifically lacking one or more elements/features. In other words, claims to certain embodiments may contain negative limitation to specifically exclude one or more elements/features resulting in embodiments which are patentably distinct from the prior art which include such features/elements.

What is claimed is:

1. A system comprising a motion sensing stack, said motion sensing stack comprising at least four magnetometers and an IMU (inertial measurement unit), the IMU comprising an accelerometer and a gyroscope; wherein at least one magnetometer is in a different plane from at least three other magnetometers; wherein the system is implemented with a plurality of dies, a first die comprising three magnetometers, a second die comprising a processor, and a third die comprising a magnetometer, the accelerometer and gyroscope, and a package, wherein said package contains said dies ordered in a plurality of stacked layers;

wherein said at least four magnetometers are calibrated according to a calibration process, said calibration process comprising: moving each magnetometer according to a defined movement; receiving magnetometer data during said defined movement; comparing magnetometer data for a plurality of magnetometers; and calibrating a frame for said plurality of magnetometers according to said comparing;

wherein said comparing magnetometer data for said plurality of magnetometers comprises determining a point cloud distribution for each magnetometer; calculating Eigen vectors for principal directions of said point cloud distribution; and comparing said Eigen vectors; wherein said calibrating comprises applying a rotation to said Eigen vectors; wherein said plurality of magnetometers are further calibrated according to data from said gyroscope and said accelerometer;

and further comprising a processor for executing a plurality of instructions, comprising: determining a differential gradient between said at least one magnetometer in a different plane and said at least three other magnetometers; calculating an azimuth according to said differential gradient; and fusing said azimuth, an orientation calculation from said gyroscope, and a tilt calculation from said accelerometer to determine a position to further calibrate said plurality of magnetometers.

2. The system of claim 1, wherein each magnetometer is a 3D magnetometer.

3. The system of claim 1, wherein said accelerometer is a 3D accelerometer.

4. The system of claim 1, wherein said gyroscope is a 3D gyroscope.

5. The system of claim 1, wherein at least one of said accelerometer and gyroscope are implemented as a MEMS (microelectromechanical system) with said IMU.

6. The system of claim 1, further comprising a processor for executing a plurality of instructions, comprising:

determining a differential gradient between said at least one magnetometer in a different plane and said at least three other magnetometers; calculating an azimuth according to said differential gradient; and fusing said azimuth, an orientation calculation from said gyroscope, and a tilt calculation from said accelerometer to determine a position.

7. The system of claim 6, wherein said azimuth is an azimuth estimation from said magnetometers.

8. The system of claim 7, wherein the fusing is implemented using an optimal estimator comprising a Kalman filter.

9. The system of claim 1, wherein said defined movement comprises rotating each magnetometer through a predetermined pattern.

10. The system of claim 9, further comprising a robotic arm for rotating each magnetometer through said predetermined pattern.

11. The system of claim 1, wherein said azimuth is an azimuth estimation from said magnetometers.

12. The system of claim 11, wherein the fusing is implemented using an optimal estimator comprising a Kalman filter.

13. A system comprising a motion sensing stack, said motion sensing stack comprising at least four magnetometers and an IMU (inertial measurement unit), the IMU comprising an accelerometer and a gyroscope; wherein the system is implemented with a plurality of dies, a first die comprising three magnetometers configured in a first MEMS (microelectromechanical system), a second die comprising a processor, and a third die comprising a second MEMS, comprising an IMU comprising a magnetometer, the accelerometer and gyroscope, and a package, wherein said package contains said dies in a plurality of stacked layers;

wherein said at least four magnetometers are calibrated according to a calibration process, said calibration process comprising: moving each magnetometer according to a defined movement; receiving magnetometer data during said defined movement; comparing magnetometer data for a plurality of magnetometers; and calibrating a frame for said plurality of magnetometers according to said comparing;

wherein said comparing magnetometer data for said plurality of magnetometers comprises determining a point cloud distribution for each magnetometer; calculating Eigen vectors for principal directions of said point cloud distribution; and comparing said Eigen vectors; wherein said calibrating comprises applying a rotation to said Eigen vectors; wherein said plurality of magnetometers are further calibrated according to data from said gyroscope and said accelerometer; and further comprising a processor for executing a plurality of instructions, comprising: determining a differential gradient between an out-of-plane magnetometer and at least three other magnetometers; calculating an azimuth according to said differential gradient; and fusing said azimuth, an orientation calculation from said gyroscope, and a tilt calculation from said accelerometer to determine a position to further calibrate said plurality of magnetometers.

14. The system of claim 13, further comprising a processor for executing a plurality of instructions, comprising:

determining a differential gradient between said out-of-plane magnetometer and said at least three other magnetometers;

calculating an azimuth according to said differential gradient;

and fusing said azimuth, an orientation calculation from said gyroscope, and a tilt calculation from said accelerometer to determine a position.

15. The system of claim 14, wherein said azimuth is an azimuth estimation from said magnetometers.

16. The system of claim 15, wherein the fusing is implemented using an optimal estimator comprising a Kalman filter.

17. The system of claim 13, wherein said defined movement comprises rotating each magnetometer through a predetermined pattern.

18. The system of claim 17, further comprising a robotic arm for rotating each magnetometer through said predetermined pattern.

19. The system of claim 13, wherein said azimuth is an azimuth estimation from said magnetometers.

20. The system of claim 19, wherein the fusing is implemented using an optimal estimator comprising a Kalman filter.

* * * * *